US012802618B2

(12) United States Patent
Li et al.

(10) Patent No.: US 12,802,618 B2
(45) Date of Patent: Nov. 17, 2026

(54) MULTI-RAIL SUBPIXEL GROUP FOR A DISPLAY

(71) Applicant: GOOGLE LLC, Mountain View, CA (US)

(72) Inventors: Bo Li, Folsom, CA (US); Edwin Lyle Hudson, San Jose, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 18/932,204

(22) Filed: Oct. 30, 2024

(65) Prior Publication Data

US 2025/0140177 A1 May 1, 2025

Related U.S. Application Data

(60) Provisional application No. 63/559,513, filed on Feb. 29, 2024, provisional application No. 63/594,769, filed on Oct. 31, 2023.

(51) Int. Cl.
*G09G 3/32* (2016.01)
*H10W 90/00* (2026.01)

(52) U.S. Cl.
CPC .............. *G09G 3/32* (2013.01); *H10W 90/00* (2026.01); *G09G 2300/0426* (2013.01); *G09G 2300/0842* (2013.01); *G09G 2330/028* (2013.01)

(58) Field of Classification Search
CPC ....... G09G 3/32–3291; G09G 2300/04; G09G 2300/0404; G09G 2300/0426; G09G 2300/0809; G09G 2300/0819; G09G 2300/0842; G09G 2300/0861; G09G 2300/0866; G09G 2310/0243–0251; G09G 2310/06; G09G 2310/08; G09G 2320/0233; G09G 2320/0242; G09G 2320/04; G09G 2320/043; G09G 2320/045; G09G 2320/062; G09G 2330/021; G09G 2330/028; H01L 25/167
See application file for complete search history.

(56) References Cited

U.S. PATENT DOCUMENTS

| | | | | |
|---|---|---|---|---|
| 2011/0205218 A1* | 8/2011 | Tsuchi | G09G 3/3283 | 345/212 |
| 2013/0286718 A1* | 10/2013 | Krilic | G11C 11/412 | 365/154 |
| 2019/0114987 A1* | 4/2019 | Li | G09G 3/3233 | |
| 2020/0251638 A1* | 8/2020 | Morris | G02B 27/0172 | |
| 2020/0410923 A1* | 12/2020 | Hudson | G09G 3/3241 | |
| 2022/0231105 A1* | 7/2022 | Liu | G09G 3/3233 | |
| 2025/0095548 A1* | 3/2025 | Posat | G09G 3/32 | |

* cited by examiner

*Primary Examiner* — Nathan Danielsen
(74) *Attorney, Agent, or Firm* — BRAKE HUGHES BELLERMANN LLP

(57) ABSTRACT

A high-resolution display that is a small size suitable for mobile applications is disclosed. The display is color and so includes different color subpixels arranged in subpixel groups. To minimize power consumption, each subpixel includes its own power rail supplying the subpixel with a rail voltage that is based on a forward voltage of a corresponding light emitting diode. To minimize the area of the subpixel group, transistors of the subpixels are fabricated within a common well and the body terminals of the transistors are connected to a common well rail that is separate from the power rails.

18 Claims, 7 Drawing Sheets

MULTI-RAIL SUBPIXEL GROUP FOR A DISPLAY

CROSS-REFERENCE TO RELATED APPLICATION

This application claims the benefit of U.S. Provisional Application No. 63/594,769, filed on Oct. 31, 2023, and U.S. Provisional Application No. 63/559,513, filed on Feb. 29, 2024, the disclosures of which are incorporated herein by reference in their entireties.

FIELD OF THE DISCLOSURE

The present disclosure relates to a display and more specifically to a display having pixels that each include a group of subpixels configured to radiate light in various colors.

BACKGROUND

A display may project information in a range of colors by transmitting component colors, such as red, green, and blue, in different proportions at each pixel. To accomplish this color display, each pixel may include a group of subpixels, each including a light emitting diode configured to radiate light in one of the component colors. The light emitting diodes for each subpixel may be made very small so that high-resolution displays may be fabricated for mobile applications (e.g., smart watches, augmented reality glasses/visors, etc.) in which the area of the display is relatively small. For these mobile applications, the power consumed by the display is an important consideration.

SUMMARY

The present disclosure describes a subpixel group that can be used in a high-resolution display. Multiple power rails tuned for each light emitting diode may increase the efficiency of the subpixel group, while the use of a well rail for transistors in the subpixel group may decrease its physical area.

In some aspects, the techniques described herein relate to a subpixel group for a display including: a plurality of power rails configured to supply rail voltages to a plurality of light emitting diodes; a plurality of drive transistors, each drive transistor coupled in series between a power rail and a light emitting diode; and a well rail coupled to a body terminal of each drive transistor, the well rail configured to supply a bulk voltage to the body terminal of each drive transistor, the bulk voltage being greater than the rail voltages supplied by the plurality of power rails.

In some aspects, the techniques described herein relate to a display including: a plurality of subpixel groups, each subpixel in each subpixel group including: a current-source transistor; a light emitting diode; and a drive transistor coupled between the current-source transistor and the light emitting diode; a plurality of power rails, each power rail configured to supply a rail voltage to one subpixel in each subpixel group, wherein not all rail voltages supplied by the plurality of power rails are equal; and a well rail configured to supply a bulk voltage to each drive transistor of each subpixel, the bulk voltage being higher than any rail voltage supply by the plurality of power rails.

In some aspects, the techniques described herein relate to a method for controlling a subpixel group for a display, the method including: coupling subpixels in the subpixel group to respective power rails; configuring the respective power rails to supply rail voltages corresponding to light emitting diodes of the subpixel group; controlling drive transistors to conduct drive currents to illuminate the light emitting diodes, each drive transistor coupled between a power rail and a light emitting diode of a subpixel, coupling body terminals of each drive transistor to a well rail for the subpixel group; and configuring the well rail to supply a bulk voltage to the body terminals, the bulk voltage being greater than the rail voltages supplied by the respective power rails.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

A display may include millions of light emitting diodes (LEDs), each having dimensions that are a few micrometers (i.e., micro-LEDs). Each pixel in the display may be a group of subpixels (i.e., subpixel group), and the subpixels may be configured to radiate light in different colors (i.e., color channels). The intensities of the color channels may be adjusted relative to one another to generate different colors to an observer. A high resolution (e.g., 8K resolution) display can control thousands of pixels (i.e., subpixel groups) to generate binary images (i.e., bit planes) in rapid succession to render grayscale levels for each color channel. One technical problem with these displays is the cumulative power consumed to render high-resolution images/video may be too high for some battery-operated devices (e.g., head-mounted device). These battery-operated devices may also require the display to have small dimensions (e.g., less than a centimeter). Another technical problem with these displays is maintaining these small dimensions when power-saving features are added. The disclosed display includes a backplane that addresses both of these technical problems so that the disclosed display can be relatively small and consume relatively low power. One technical effect of this solution is a longer operating life for battery-operated devices using the disclosed display.

Figure 1:
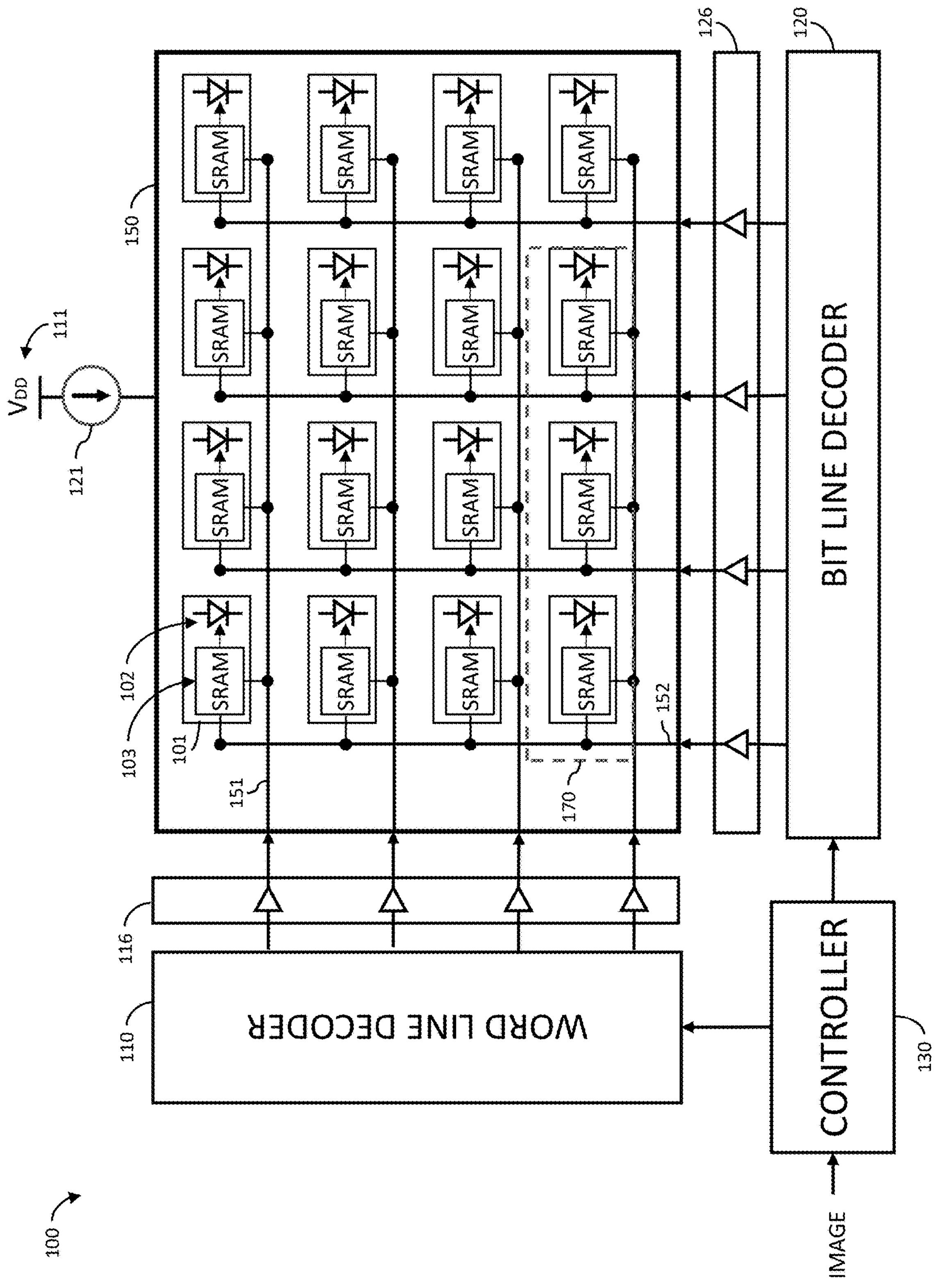
FIG. 1 is a schematic block diagram of a display according to a possible implementation of the present disclosure.

FIG. 1 is a schematic block diagram of a display according to a possible implementation of the present disclosure. The display 100 includes an array 150 of subpixels arranged in a grid so that each subpixel in a row may be addressed by a word line 151 and each subpixel in a column may be addressed by a bit line 152. The subpixels may be grouped logically and physically to form a subpixel group 170 of the display. The subpixel group 170 can include subpixels configured to radiate different colors (e.g., red, green, and blue). While shown as including three subpixels arranged in a row, a subpixel group may include more (e.g., four) subpixels and the group may be shaped differently (e.g., square). In any case, the technology disclosed may be used with subpixel groups of any shape or size.

Each subpixel 101 includes a light emitting diode (LED 102) and a memory cell 103. The memory cell 103 can be configured to store a 1-bit binary value (i.e., 1, 0) and the ON/OFF condition of the LED 102 can correspond to the binary value. In a possible implementation, the memory cell 103 is a static random access memory cell (i.e., SRAM cell).

Control of the LED 102 can be carried out by a write operation to the memory cell 103. After the write operation, the memory cell 103 cell may maintain the LED 102 in the ON condition or the OFF condition with very little power consumed. A write operation may include transmitting a word line signal, which couples the memory cells of a row of pixels to respective bit lines. The write operation may further include transmitting the binary information required for each subpixel in the (activated) row to respective bit lines. In this way, an image may be rendered row-by-row.

The display 100 can include a current source 121 powered by a power supply 111 configured to supply current to illuminate the LEDs of the pixels in the ON condition. The display 100 can further include a controller 130. The controller may receive an image and may be configured (e.g., software instructions) to provide the timing and signals necessary to render the image on the array 150. The display 100 further includes a word line decoder 110 that can include logic and routing circuitry configured to convey the word line signals from the controller 130 to the proper rows of the array 150. The display 100 may further include a word line driver 116 that includes amplifiers for each word line configured to amplify and buffer the word line signals. The display 100 further includes a bit line decoder 120 that can include logic, routing, and possibly buffering circuitry configured to convey the bit line signals from the controller 130 to the proper columns of the array 150. The display 100 may further include a bit line driver 126 that includes amplifiers for each bit line configured to amplify and buffer the bit line signals.

Figure 2:
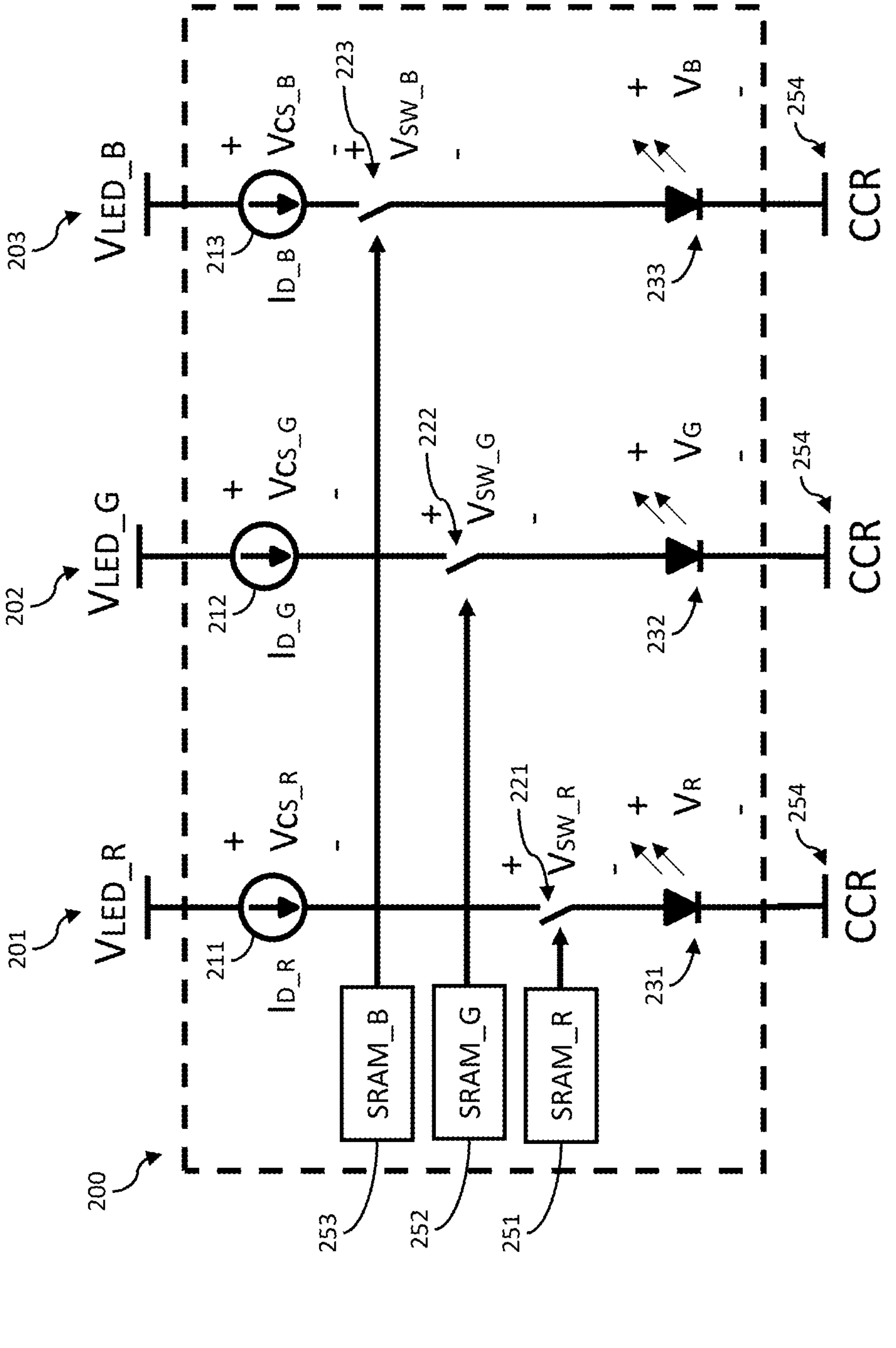
FIG. 2 is a schematic block diagram of a subpixel group for a display according to a possible implementation of the present disclosure.

FIG. 2 is a schematic block diagram of a subpixel group for a display according to a possible implementation of the present disclosure. The subpixel group 200 includes three subpixels: a red subpixel, a green subpixel, and a blue subpixel.

The red subpixel includes a first LED (e.g., red LED 231) configured to radiate light (e.g., red light) when coupled to a first current source 211 by a first switch 221 (e.g., first transistor). The first switch 221 is controlled by a state of a first SRAM 251. The first current source 211 is configured to supply a first drive current (i.e., red drive current ($I_{D\_R}$)) at a level specific to (i.e., set for) the red LED 231. For example, the level of the red drive current may be based on brightness and/or a wavelength of the red light emitted by the red LED 231. The red subpixel is powered by a first power rail 201. A first rail voltage ($V_{LED\_R}$) of the first power rail 201 is specific to (i.e., set for) the red LED 231. For example, the first rail voltage ($V_{LED\_R}$) may be at least a first forward voltage ($V_R$) of the red LED 231 when the red LED 231 is in the ON condition (i.e., illuminated).

From FIG. 2, it can be observed that the first rail voltage ($V_{LED\_R}$) supplied by the first power rail 201 is the sum of the voltages across the red LED 231, the first switch 221, and the first current source 211. The voltage ($V_{SW\_R}$) across the first switch 221 is approximately (e.g., equal to) zero when the red LED 231 is in the ON condition. The voltage ($V_{CS\_R}$) Across the First current source 211 may be described by the equation $V_{CS\_R}=V_{LED\_R}-V_R$. From this equation it can be observed that if the first rail voltage ($V_{LED\_R}$) is much greater than the first forward voltage ($V_R$) of the red LED 231, then the voltage ($V_{CS\_R}$) across the first current source 211 will be higher than required to produce the first drive current ($I_{D\_R}$), and the subpixel will consume more power than necessary. In other words, the subpixel will operate inefficiently unless the first rail voltage is adjusted (e.g., lowered) so that it is slightly above the first forward voltage ($V_R$) of the red LED 231.

The green subpixel includes a second LED (e.g., green LED 232) configured to radiate light (e.g., green light) when coupled to a second current source 212 by a second switch 222 (e.g., second transistor). The second switch 222 is controlled by a state of a second SRAM 252. The second current source 212 is configured to supply a second drive current (i.e., green drive current ($I_{D\_G}$)) at a level specific to (i.e., set for) the green LED 232. For example, the level of the green drive current may be based on brightness and/or a wavelength of the green light emitted by the green LED 232. The green subpixel is powered by a second power rail 202. A second rail voltage ($V_{LED\_G}$) of the second power rail 202 is specific to (i.e., set for) the green LED 232. For example, the second rail voltage ($V_{LED\_G}$) may be at least a second forward voltage ($V_G$) of the green LED 232 when the green LED 232 is in the ON condition (i.e., illuminated).

The blue subpixel includes a third LED (e.g., blue LED 233) configured to radiate light (e.g., blue light) when coupled to a third current source 213 by a third switch 223 (e.g., third transistor). The third switch 223 is controlled by a state of a third SRAM 253. The third current source 213 is configured to supply a third drive current (i.e., blue drive current ($I_{D\_B}$)) at a level specific to (i.e., set for) the blue LED 233. For example, the level of the blue drive current may be based on brightness and/or a wavelength of the blue light emitted by the blue LED 233. The blue subpixel is powered by a third power rail 203. A third rail voltage ($V_{LED\_B}$) of the third power rail 203 is specific to (i.e., set for) the blue LED 233. For example, the third rail voltage ($V_{LED\_B}$) may be at least a third forward voltage ($V_B$) of the blue LED 233 when the blue LED 233 is in the ON condition (i.e., illuminated).

Each LED may be a micro-LED having a different forward voltage. For example, the first forward voltage ($V_R$) of the red LED 231 may not equal either the second forward voltage ($V_G$) of the second LED (i.e., green LED 232) or the third forward voltage ($V_B$) of the third LED (i.e., blue LED 233). In a possible implementation, the first forward voltage ($V_R$) is less than the second forward voltage ($V_G$), and the third forward voltage ($V_B$). In another possible implementation, the second forward voltage ($V_G$) is equal to the third forward voltage ($V_B$) but not equal to the first forward voltage ($V_R$). In another possible implementation, each forward voltage is different (e.g., $V_R \neq V_G \neq V_B$). Accordingly, for the subpixel group to operate most efficiently, each subpixel can have a dedicated power rail. As shown, the red subpixel is powered by the first power rail 201, the green subpixel is powered by the second power rail 202, and the blue subpixel is powered by the third power rail 203. The rail voltages of each of the power rails may be different and each may be relative to a common lower rail (i.e., a common cathode rail (CCR 254)).

Figure 3:
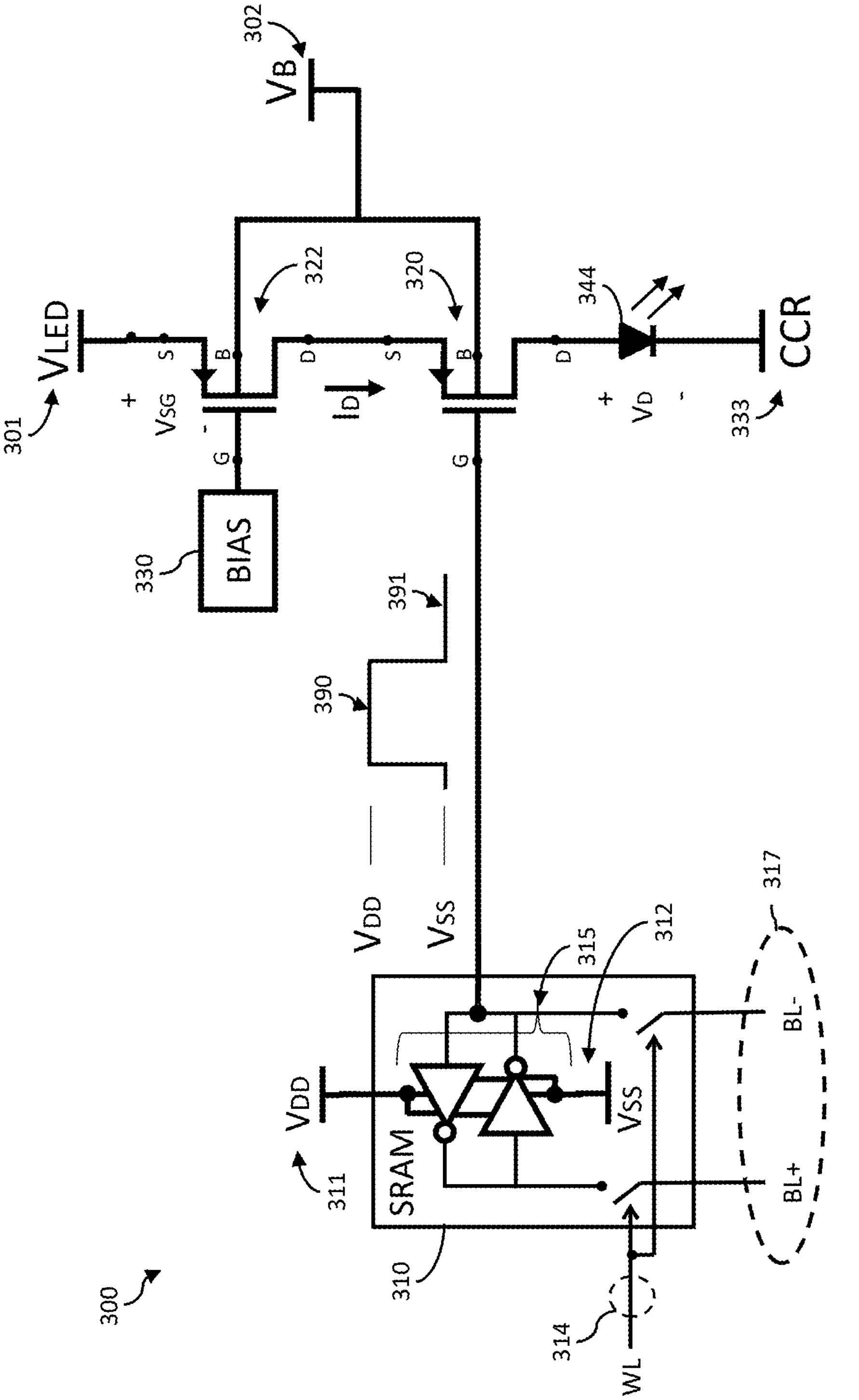
FIG. 3 is a detailed schematic of a subpixel according to a possible implementation of the present disclosure.

FIG. 3 is a detailed schematic of a subpixel according to a possible implementation of the present disclosure. The subpixel 300 includes a current-source transistor 322 that is coupled, at a gate terminal (G)), to a bias control 330. As shown, the current-source transistor 322 can be a p-type metal oxide semiconductor (PMOS) transistor. The bias control 330 is configured to generate a bias voltage ($V_{BIAS}$) so that a source-gate voltage ($V_{SG}=V_{LED}-V_{BIAS}$) is below threshold voltage by an amount to provide the drive current ($I_D$) at a drain terminal (D).

The subpixel 300 further includes a series connection including a drive transistor 320 coupled between the current-source transistor 322 and the light emitting diode 344. As shown, the drive transistor 320 can be a PMOS transistor. A source terminal of the drive transistor 320 is coupled to a drain terminal of the current-source transistor 322 and a drain terminal of the drive transistor 320 is coupled to an anode of the light emitting diode 344.

The series connection receives a rail voltage ($V_{LED}$) supplied by a power rail 301, and the drive current ($I_D$) flows through the light emitting diode 344 to a CCR 333 (e.g., ground) when the drive transistor 320 is configured in an ON condition (i.e., conducting). The drive transistor 320 can be configured ON or OFF by a SRAM cell 310 coupled (at an output) to a gate terminal (G) of the drive transistor 320.

The SRAM cell 310 may be powered by power rails that are the same or different as the series connection. As shown, the SRAM cell 310 includes a latch circuit 315 configured to output an upper rail voltage 311 ($V_{DD}$) in a first state and a lower rail voltage 312 ($V_{SS}$) in a second state. A gate terminal (G) of the drive transistor 320 can receive the voltage corresponding to the state of the latch circuit and turn ON (i.e., conduct) or OFF (i.e., not conduct) in response. Being p-type, the drive transistor 320 may be OFF when the latch circuit 315 is in the first state 390 and the drive transistor 320 may be ON when the latch circuit 315 is in the second state 391.

The state of the latch circuit 315 can be controlled by bit line signals (BL+, BL−) transmitted over a bit line 317 to the subpixel 300. The bit lines may be coupled to the latch circuit 315 by switches controlled by a word line signal transmitted over a word line 314 to the subpixel 300.

The current-source transistor 322 and the drive transistor 320 include body terminals (B), which are coupled to a common well in a substate in which the p-type transistors are fabricated. As will be discussed, the common well is shared by the transistors so that they can be fabricated closer together than if they each had their own well. A bulk voltage ($V_B$) may be supplied to the body terminals by a well rail 302. To ensure proper operation, the bulk voltage ($V_B$) should be at least equal to the rail voltage ($V_{LED}$) when the transistors share a common well.

Figure 4:
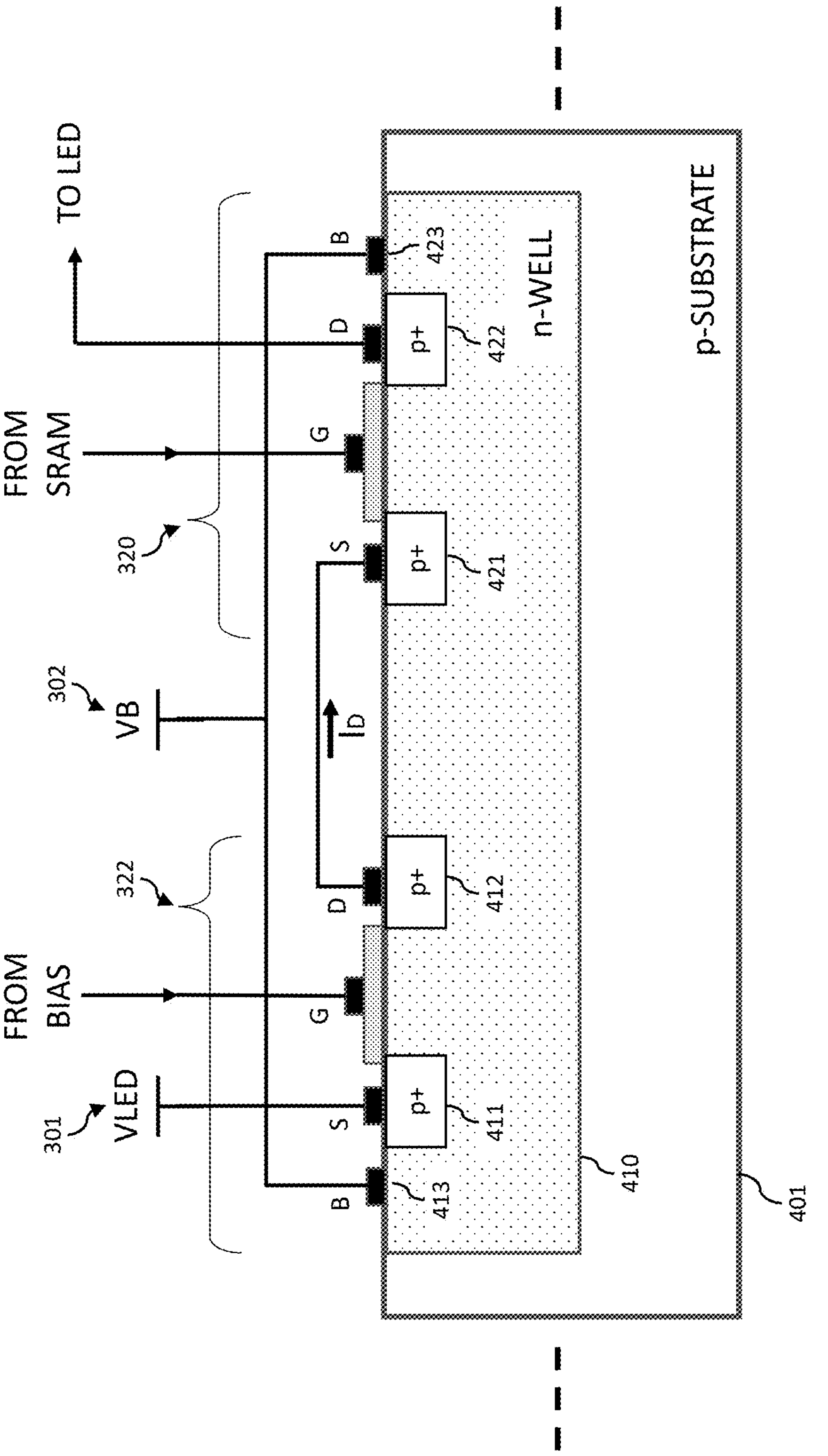
FIG. 4 is a cross-section of transistors of a subpixel according to a possible implementation of the present disclosure.

FIG. 4 is a cross-section of transistors of a subpixel according to a possible implementation of the present disclosure. As shown, the (PMOS) current-source transistor 322 and the (PMOS) drive transistor 320 can be fabricated in a common well 410. The common well 410 is an n-type material (e.g., silicon) contained in a substrate 401 of p-type material (e.g., silicon). The current-source transistor 322 includes a source terminal 411 and a drain terminal 412, which are p+-type regions embedded in (i.e., implanted in) the common well 410. As shown, the current-source transistor 322 is coupled to the power rail 301 at its source terminal 411 (S) and receives a bias voltage at its gate terminal (G) so that a drive current ($I_D$) flows to the source terminal 421 of the drive transistor 320. The drive transistor 320 can be turned ON (by a signal at its gate terminal (G)) so that the drive current flows from the source terminal 421 to the drain terminal 422, which is connected to the LED.

The body terminal 413 of the current-source transistor 322 is coupled directly to the common well 410. As a result, a bulk voltage (VB) applied to the body terminal 413 is transmitted to the common well 410. The body terminal 423 of the drive transistor 320 is also coupled directly to the common well 410. As a result, if a voltage other than the bulk voltage were applied to the body terminal 423, then a current would be generated in the common well 410. To prevent this current from disrupting operation and/or causing damage, the body terminals are coupled together to the well rail 302.

Returning to FIG. 2, in order to minimize a size (i.e., area) of the subpixel group 200 it is desirable to fabricate all transistors in a common well in the substrate. Otherwise, fabrication rules may require added spacing between separate wells in the substrate, which could increase the size of the subpixel group. As discussed in conjunction with FIG. 4, when transistors share a common well their body terminals are coupled together to receive a (common) bulk voltage to prevent an unwanted current. Another unwanted current could flow in body diodes that are forward biased when the bulk voltage applied to the body terminals is not greater than the rail voltages of the subpixels.

Figure 5:
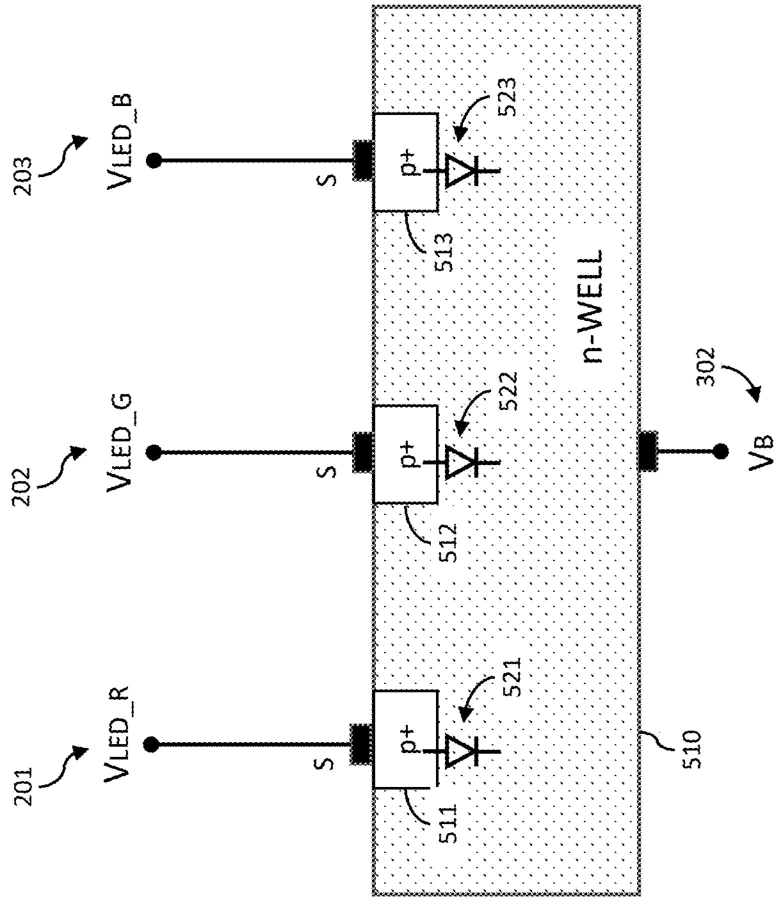
FIG. 5 is a cross-section illustrating body diodes of a subpixel group according to a possible implementation of the present disclosure.

FIG. 5 is a cross-section illustrating body diodes of a subpixel group according to a possible implementation of the present disclosure. The subpixel group includes three drive transistors. In practice, the common well may include all drive transistors and all current-source transistors of the subpixel group, but FIG. 5 illustrates only the source terminal of each of the three current-source transistors of the subpixel group.

As shown in FIG. 5, a first body diode 521 is formed at the p-n junction between the first source terminal 511 coupled to first power rail 201 and the common well 510; a second body diode 522 is formed at the p-n junction between the second source terminal 512 coupled to second power rail 202 and the common well 510; and a third body diode 523 is formed at the p-n junction between the third source terminal 513 coupled to third power rail 203 and the common well 510. To prevent forward biasing any of the body diodes, the bulk voltage ($V_B$) of the common well 410 (supplied by the well rail 302) must be greater than any of the first rail voltage ($V_{LED\_R}$), the second rail voltage ($V_{LED\_G}$), and the third rail voltage ($V_{LED\_B}$). In other words, the bulk voltage ($V_B$) must be greater than the maximum rail voltage of all of the power rails.

Figure 6:
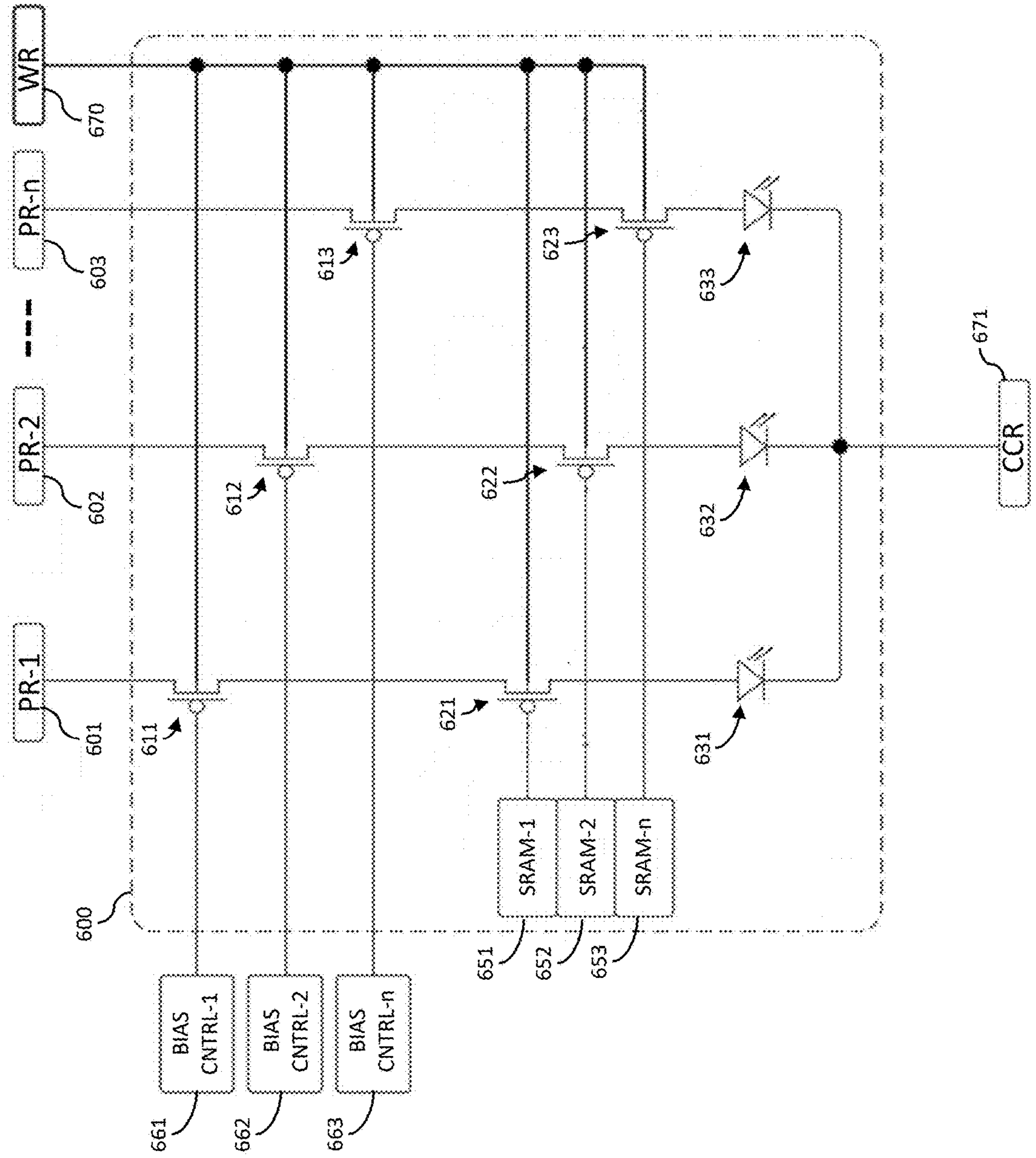
FIG. 6 is a subpixel group for a display according to a possible implementation of the present disclosure.

FIG. 6 is a subpixel group for a display according to a possible implementation of the present disclosure. The subpixel group includes a plurality of power rails (e.g., n≥3). As shown, a first power rail 601 may be configured to supply a first rail voltage to a first subpixel (e.g., red sub pixel) of the subpixel group 600, a second power rail 602 may be configured to supply a second rail voltage to a second subpixel (e.g., green subpixel) of the subpixel group 600, and a third power rail 603 may be configured to supply a third rail voltage to a third subpixel (e.g., blue sub pixel of the subpixel group 600.

Using a power rail for each subpixel allows for the rail voltage supplied by the power rails to be the same (i.e., equal) or different (i.e., not equal). As a result, each power rail may have a rail voltage that corresponds to (e.g., is offset by a fixed amount above) the forward voltage of the LED of the subpixel. The customized rail voltage for each subpixel prevents using a higher voltage than necessary to power the subpixel, which could waste power. In other words, the rail voltage supplied by the power rails can reduce the power consumed by each subpixel group 600. In a possible implementation, the power rails are coupled to (i.e., shared by) the subpixel groups of a display so that subpixels of a common type (e.g., red, green, blue) are supplied with the same rail voltage. In this case, the rail voltage may be at a level that also accommodates variations in the forward voltage of the subpixels.

The subpixel group 600 further includes a well rail 670 coupled to a body terminal of each transistor of the subpixel group 600. The well rail 670 is configured to supply a bulk voltage to the transistors (e.g., drive transistors, current-source transistors) of the subpixel group 600. The bulk voltage can be made greater than the rail voltages of the subpixels so that the transistors may be fabricated closer together on a substrate, thereby minimizing the physical dimensions (e.g., area) of the subpixel. In a possible implementation, the subpixel separation (i.e., pitch) is less than 5 microns. In a possible implementation, the bulk voltage is greater than or equal to the maximum rail voltage of the power rails. Connecting the body terminals allows the transistors (e.g., p-type transistors) to be fabricated within a common well (e.g., n-type common well) of a substrate. The bulk voltage being greater than the rail voltages prevents a body diode within a common well of the substrate from being forward biased. In a possible implementation, the well rail is coupled to (i.e., shared by) the subpixel groups of a display so that the transistors of the subpixels receive the same bulk voltage. In this case, the bulk voltage may be at a level that also accommodates variations in the rail voltages.

The subpixel group 600 further includes a plurality of current sources. Each subpixel may include a current source configured to generate a drive current corresponding to the LED of the subpixel. The drive currents for the subpixel in a subpixel group 600 can be the same or different. The customized drive current for each subpixel can prevent artifacts, such as color shifts, in the light generated by each subpixel.

Each current source of the subpixel group 600 includes a current-source transistor biased by a power rail and a bias control. The first current-source transistor 611 is coupled at a source terminal to the first power rail 601 and is coupled at a gate terminal to a first bias control 661. The first bias control 661 is configured to supply a first bias voltage relative to the first rail voltage so that the first current-source transistor 611 can conduct a first drive current. The second current-source transistor 612 is coupled at a source terminal to the second power rail 602 and is coupled at a gate terminal to a second bias control 662. The second bias control 662 is configured to supply a second bias voltage relative to the second rail voltage so that the second current-source transistor 612 can conduct a second drive current. The third bias control 663 is configured to supply a third bias voltage relative to the third rail voltage so that the third current-source transistor 613 can conduct a third drive current. In a possible implementation, the bias controls are coupled to (i.e., shared by) the subpixel groups of a display so that the current-source transistors of a particular subpixel (e.g., red, green, blue) receive the same bias voltage. In this case, the bias voltage may be at a level that accommodates transistor variations due to process or temperature.

The subpixel group further includes a plurality of SRAM cells and a plurality of drive transistors. A state of the SRAM cell may control a drive transistor of a subpixel to be in an ON condition to conduct the drive current or in an OFF condition to block the drive current. In the ON condition, the drive transistor has approximately a zero voltage drop (i.e., short circuit). As shown, the subpixel group 600 includes a first drive transistor 621. The first drive transistor 621 is a PMOS transistor that (i) coupled at a source terminal to the drain terminal of the first current-source transistor 611, (ii) coupled at a gate terminal to a first SRAM 651, and (iii) coupled at a drain terminal to an anode of a first LED 631 (e.g., red micro-LED). The subpixel group 600 further includes a second drive transistor 622. The second drive transistor 622 is a PMOS transistor that (i) coupled at a source terminal to the drain terminal of the second current-source transistor 612, (ii) coupled at a gate terminal to a second SRAM 652, and (iii) coupled at a drain terminal to an anode of a second LED 632 (e.g., green micro-LED). The subpixel group 600 further includes a third drive transistor 623. The third drive transistor 623 is a PMOS transistor that (i) coupled at a source terminal to the drain terminal of the third current-source transistor 613, (ii) coupled at a gate terminal to a third SRAM 653, and (iii) coupled at a drain terminal to an anode of a third LED 633 (e.g., blue micro-LED). In other words, the current-source transistor, the drive transistor and the LED of each subpixel are connected in series (i.e., form a series connection). The cathodes terminals of the first LED 631, second LED 632, and third LED 633 can be connected together and coupled to a common cathode rail 671, which can be a ground voltage (i.e., ground) of the display. In other words, all of the power rails may be relative to the common cathode rail 671.

Figure 7:
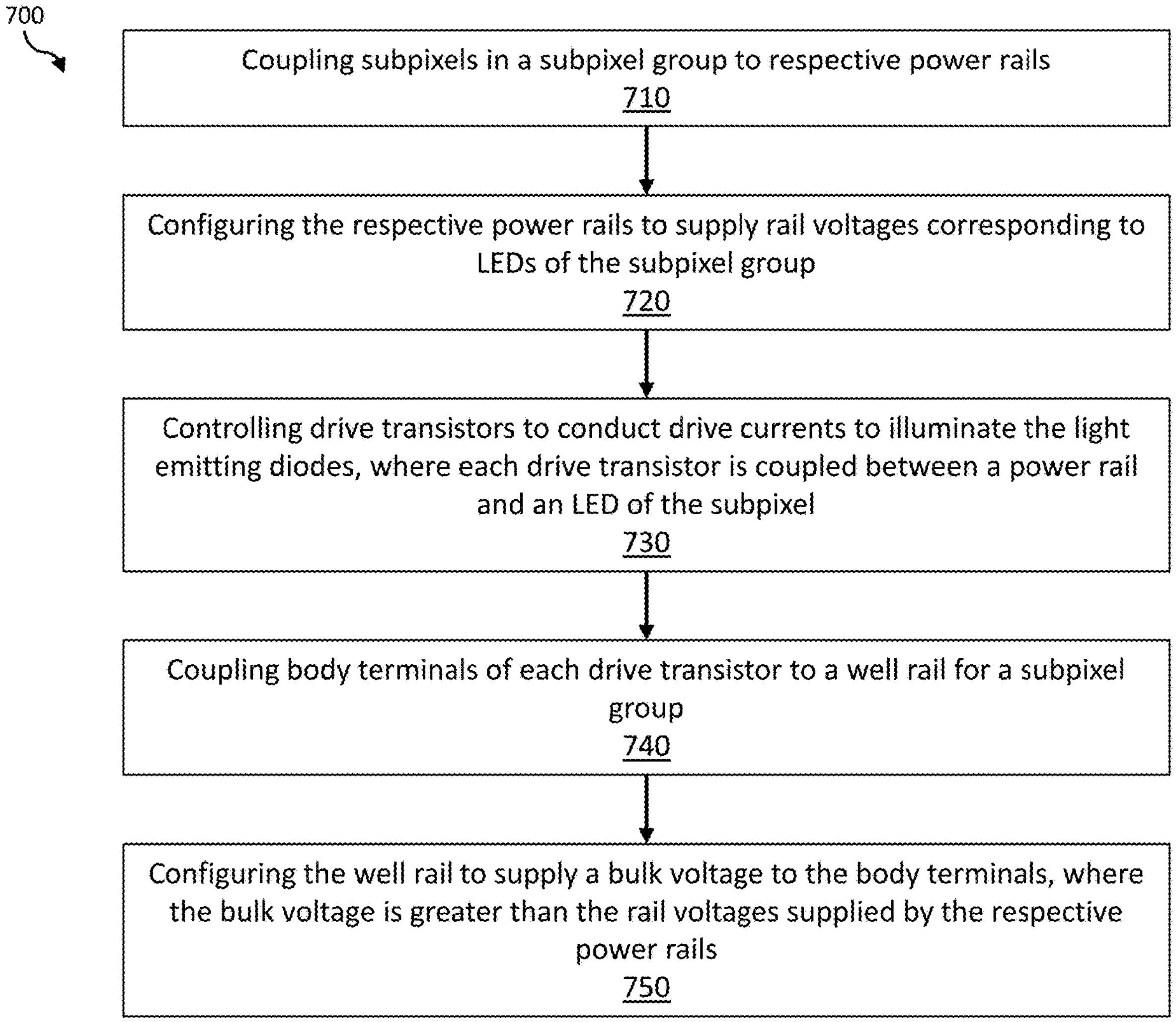
FIG. 7 is a flowchart of a method for controlling a subpixel group for a display according to a possible implementation of the present disclosure.

FIG. 7 is a flowchart of a method for controlling a subpixel group for a display according to a possible implementation of the present disclosure. The method 700 includes coupling 710 subpixels in a subpixel group to respective power rails and configuring 720 the respective power rails to supply a plurality of rail voltage, where the plurality of rail voltages correspond to (i.e., are based on) the forward voltages of the LEDs. The method 700 further includes controlling 730 each drive transistor, coupled between a power rail and an LED of the subpixel group, to conduct a drive current to illuminate a respective LED. The method 700 further includes coupling 740 body terminals of the drive transistors to a well rail and configuring 750 the well rail to supply a bulk voltage to the body terminals. The bulk voltage supplied is greater than the rail voltages supplied by the power rails.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A subpixel group for a display comprising:

a plurality of power rails configured to supply rail voltages to a plurality of light emitting diodes;

a plurality of drive transistors fabricated within a single common well in a substrate, the common well configured to enable a pitch between the plurality of light emitting diodes of less than five microns, each drive transistor coupled in series between a power rail and a respective light emitting diode;

a plurality of memory cells coupled to respective terminals of the plurality of drive transistors to control the plurality of light emitting diodes; and a well rail coupled to a body terminal of each drive transistor, the well rail configured to supply a single bulk voltage to the single common well via the body terminal of each drive transistor, the single bulk voltage being greater than any of the rail voltages supplied by the plurality of power rails to prevent forward biasing of body diodes formed between the plurality of drive transistors and the single common well.

2. The subpixel group for the display according to claim 1, wherein:

the rail voltages supplied by the plurality of power rails correspond to forward voltages generated by each of the plurality of light emitting diodes.

3. The subpixel group for the display according to claim 1, wherein:

not all of the rail voltages supplied by the plurality of power rails are equal; and the bulk voltage is greater than a maximum of the rail voltages supplied by the plurality of power rails.

4. The subpixel group for the display according to claim 1, wherein:

the pitch between the plurality of light emitting diodes of the subpixel group is between 1 and 5 microns.

5. The subpixel group for the display according to claim 1, wherein:

the display is a color display; and the plurality of light emitting diodes include:

a red micro-LED;

a green micro-LED; and a blue micro-LED.

6. The subpixel group for the display according to claim 1, wherein:

the plurality of drive transistors are p-type transistors each having terminals embedded in the common well shared by the plurality of drive transistors, the common well being n-type and the terminals being p-type; and the body diodes are formed between each terminal and the common well.

7. The subpixel group for the display according to claim 1, further comprising:

a plurality of current-source transistors, each current-source transistor coupled in a series connection between a corresponding power rail and a corresponding drive transistor; and a plurality of bias controls coupled to gate terminals of the plurality of current-source transistors that configured the plurality of current-source transistors to conduct a drive current.

8. The subpixel group for the display according to claim 7, wherein:

each current-source transistor is a p-type metal oxide semiconductor transistor fabricated within the single common well; and each current-source transistor has a respective body terminal coupled to the well rail so that the single bulk voltage is supplied to the single common well via the respective body terminal of each current-source transistor.

9. The subpixel group for the display according to claim 7, wherein:

the plurality of bias controls are configured to generate bias voltages, each bias voltage based on a rail voltage of the corresponding power rail to reduce a power consumed by each current-source transistor.

10. The subpixel group for the display according to claim 1, wherein the plurality of memory cells include:

SRAM cells coupled to gate terminals of the plurality of drive transistors, a state of each SRAM cell controlling an ON/OFF condition of a corresponding drive transistor.

11. The subpixel group for the display according to claim 10, wherein:

each SRAM cell is coupled to a word line and a bit line of the display.

12. The subpixel group for the display according to claim 1, wherein:

a first memory cell of the plurality of memory cells is coupled to a first drive transistor of the plurality of drive transistors to control a first light emitting diode, and a second memory cell of the plurality of memory cells is coupled to a second drive transistor of the plurality of drive transistors to control a second light emitting diode.

13. A display comprising:

a plurality of subpixel groups that each include a plurality of subpixels, each subpixel in each subpixel group including:

a current-source transistor fabricated within a single common well in a substrate;

a light emitting diode;

a drive transistor fabricated within the single common well in the substrate, the drive transistor coupled between the current-source transistor and the light emitting diode; and a memory cell coupled to a terminal of the drive transistor to control the light emitting diode;

a plurality of power rails, each power rail configured to supply rail voltage to one subpixel in each subpixel group; and a well rail configured to supply a single bulk voltage to the single common well, the single bulk voltage being higher than any of the rail voltages to prevent forward biasing body diodes formed between the drive transistor and the single common well and formed between the current-source transistor and the single common well, the single common well enabling a pitch between the plurality of subpixels of less than five microns.

14. The display according to claim 13, further comprising a plurality of bias controls, each bias control configured to bias the current-source transistor in each subpixel according to a corresponding rail voltage so that each current-source transistor conducts a drive current.

15. The display according to claim 13, wherein the rail voltages supplied by the plurality of power rails correspond to forward voltages of the light emitting diode of each subpixel to reduce a power consumed by each subpixel group.

16. A method for controlling a subpixel group for a display, the method comprising:

coupling subpixels in the subpixel group to respective power rails;

configuring the respective power rails to supply rail voltages corresponding to a plurality of light emitting diodes of the subpixel group;

controlling a plurality of drive transistors, which are fabricated within a single common well in a substrate, via a plurality of memory cells coupled to respective terminals of the plurality of drive transistors to conduct drive currents to illuminate the plurality of light emitting diodes, each drive transistor coupled between a power rail and a respective light emitting diode of a subpixel, the single common well configured to enable a pitch between the plurality of light emitting diodes of less than five microns;

coupling a body terminal of each drive transistor to a well rail for the subpixel group; and configuring the well rail to supply a single bulk voltage to the single common well via the body terminal of each drive transistor, the single bulk voltage being greater than any of the rail voltages supplied by the respective power rails to prevent forward biasing of body diodes formed between the plurality of drive transistors and the single common well.

17. The method for controlling the subpixel group of the display according to claim 16, further comprising:

reducing a power consumed by the subpixel group by:

supplying a first subpixel having a first light emitting diode with a lower rail voltage; and supplying a second subpixel having a second light emitting diode with a higher rail voltage.

18. The method according to claim 17, wherein:

the first light emitting diode is a red micro-LED; and the second light emitting diode is a green micro-LED.

* * * * *